(12) United States Patent
Jeong et al.

(10) Patent No.: US 8,692,451 B2
(45) Date of Patent: Apr. 8, 2014

(54) LIGHT EMITTING DIODE, AND BACK LIGHT UNIT INCLUDING THE SAME

(75) Inventors: Hwan Hee Jeong, Seoul (KR); Sang Youl Lee, Seoul (KR); June O Song, Seoul (KR); Kwang Ki Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/271,670

(22) Filed: Oct. 12, 2011

(65) Prior Publication Data

US 2012/0033409 A1 Feb. 9, 2012

(30) Foreign Application Priority Data

Oct. 19, 2010 (KR) .................... 10-2010-0101841

(51) Int. Cl.
*H05B 33/00* (2006.01)

(52) U.S. Cl.
USPC .............................. 313/498; 257/13

(58) Field of Classification Search
USPC .............................. 257/13; 313/498
See application file for complete search history.

(56) References Cited

U.S. PATENT DOCUMENTS

| | | | |
|---|---|---|---|
| 6,744,196 B1* | 6/2004 | Jeon | 313/498 |
| 2001/0006461 A1* | 7/2001 | Okuno | 362/311 |
| 2008/0191191 A1* | 8/2008 | Kim | 257/13 |
| 2009/0173952 A1* | 7/2009 | Takeuchi et al. | 257/79 |
| 2010/0207159 A1* | 8/2010 | Jeong | 257/103 |

\* cited by examiner

*Primary Examiner* — Andrew Coughlin
(74) *Attorney, Agent, or Firm* — KED & Associates, LLP

(57) ABSTRACT

Embodiments provide a light emitting device including a light emitting structure including a first conductive type semiconductor layer, an active layer, and a second conductive type semiconductor layer, and a protective layer disposed at a side of the light emitting structure, and a first electrode formed on an outside of the protective layer.

21 Claims, 12 Drawing Sheets

LIGHT EMITTING DIODE, AND BACK LIGHT UNIT INCLUDING THE SAME

CROSS REFERENCE TO RELATED APPLICATION

This application claims priority under 35 U.S.C §119 to Korean Patent Application No. 10-2010-0101841, filed on Oct. 19, 2010, which is hereby incorporated by reference as if fully set forth herein.

TECHNICAL FIELD

Embodiments relate to a light emitting device and backlight unit including the same.

BACKGROUND

The light emitting device, such as a light emitting diode of III-V group or II-VI group compound semiconductor or a laser diode, can produce various colors, such as red, blue, and ultra-violet owing to development of the thin film growth technology and device materials therefor, as well as a white color of good efficiency by using a fluorescent material or mixing colors, and is advantageous in that the light emitting device has power consumption lower than the present light sources, such as a fluorescent light and an incandescent light, a semi-permanent lifetime, fast response speed, and safety, and is environment friendly.

Accordingly, application of the light emitting device is expanding even to transmission modules of optical communication means, a light emitting diode back light unit which is replacing CCFL (Cold Cathode Fluorescence Lamp) of the back light unit in an LCD (Liquid Crystal Display) device, white light emitting diode lighting fixtures, car head lights, and signal lamps.

SUMMARY

Accordingly, embodiments provide a light emitting device.

Embodiments provide a light emitting device in which a first electrode is formed at a side of a light emitting structure to make a smooth current flow in the light emitting device to reduce an operation voltage of the light emitting device for improving efficiency of the light emitting device.

Additional advantages, objects, and features of the disclosure will be set forth in part in the description which follows and in part will become apparent to those having ordinary skill in the art upon examination of the following or may be learned from practice of the embodiments. The objectives and other advantages of the embodiments may be realized and attained by the structure particularly pointed out in the written description and claims hereof as well as the appended drawings.

To achieve these objects and other advantages and in accordance with the purpose of the embodiment, as embodied and broadly described herein, a light emitting device includes a light emitting structure including a first conductive type semiconductor layer, an active layer, and a second conductive type semiconductor layer, and a protective layer disposed at a side centered on the light emitting structure, and a first electrode formed on an outside of the protective layer.

In one embodiment, a light emitting diode includes a second conductive type semiconductor layer and an active layer formed on the second conductive type semiconductor layer, a protective layer formed at sides of the second conductive type semiconductor layer and the active layer, a first conductive type semiconductor layer formed on the active layer and the protective layer, and a first electrode formed on an outside of the protective layer and at least one side of the first conductive type semiconductor layer.

In another embodiment, a light emitting diode includes a second conductive type semiconductor layer and an active layer formed on the second conductive type semiconductor layer, a protective layer formed at sides of the second conductive type semiconductor layer and the active layer, a first conductive type semiconductor layer formed on the active layer and the protective layer, and a first electrode formed on an outside of the protective layer and at least one side of the first conductive type semiconductor layer.

It is to be understood that both the foregoing general description and the following detailed description of the embodiment are exemplary and explanatory and are intended to provide further explanation of the embodiment as claimed.

BRIEF DESCRIPTION OF THE DRAWINGS

Arrangements and embodiments may be described in detail with reference to the following drawings in which like reference numerals refer to like elements and wherein:

FIGS. 2A~2l illustrate sections showing the steps of a method for fabricating a light emitting device in accordance with a first embodiment.

DESCRIPTION OF EMBODIMENTS

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

Figure 1:
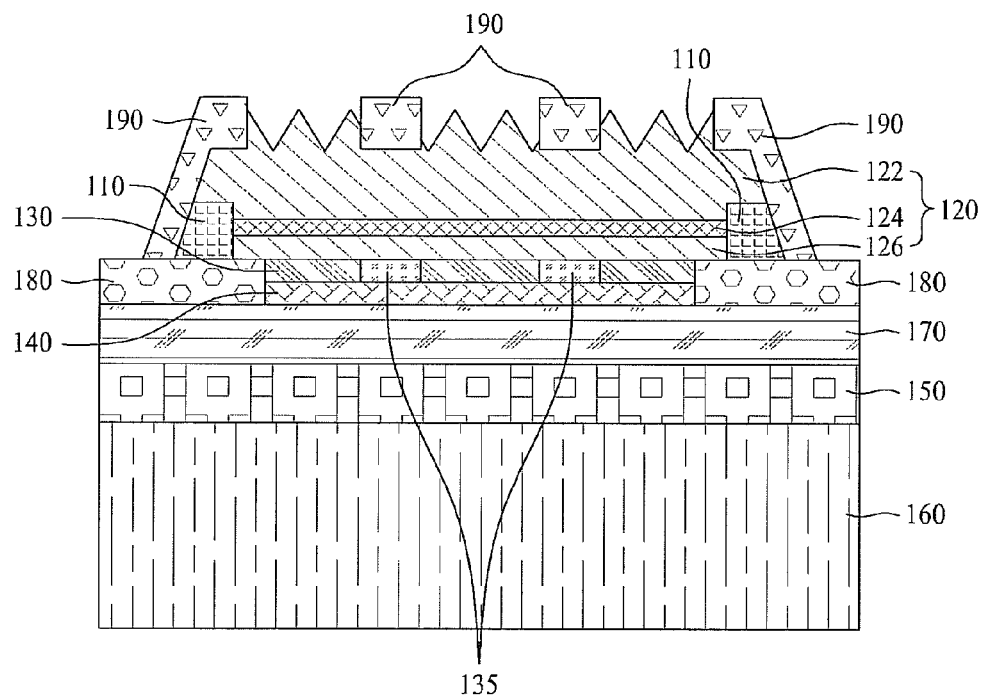
FIG. 1 illustrates a section of a light emitting device in accordance with a first embodiment having a light emitting diode.

A thickness or a size of a layer shown in a drawing can be exaggerated, omitted or shown schematically for convenience or clarity of description. And, a size of an element may not be shown to scale, perfectly. FIG. 1 illustrates a section of a light emitting device in accordance with a first embodiment having a light emitting diode.

Referring to FIG. 1, the light emitting device includes a bonding layer 150 on a supporting substrate 160, a conductive supporting layer 170 on the bonding layer 150, a channel layer 180 on the conductive supporting layer 170, a reflective layer 140 on the conductive supporting layer 170, an ohmic layer 130 on the reflective layer 140, a light emitting structure 120 having a first conductive type semiconductor layer 122, an active layer 124, and a second conductive type semiconductor layer 126, a protective layer 110 at a side of the second conductive type semiconductor layer 126, and a first electrode 190 on at least a portion of the first conductive type semiconductor layer 122 and at a side of the light emitting structure.

In these embodiments or other embodiments, the light emitting device may be semiconductor light emitting device, for example, light emitting diode.

As shown, the light emitting device can have the bonding layer 150, and the conductive supporting layer 170 disposed on the supporting substrate 160.

The conductive supporting layer 170 can be formed of a material selected from a group including nickel Ni, platinum Pt, tungsten W, vanadium V, iron Fe, and molybdenum Mo, or an alloy of materials selected from above.

The conductive supporting layer 170 can minimize mechanical damage (Breakage, or peel off) which is liable to take place in view of nature of fabrication process of the light emitting device.

The channel layer 180 can be formed of a conductive material, or an insulating material of a non-conductive oxide or nitride. As an example, the channel layer 180 can be comprised of at least one selected from, but not limited to, a silicon oxide $SiO_2$ layer, a silicon nitride $Si_3N_4$ layer, a titanium oxide TiOx, or an aluminum oxide $Al_2O_3$ layer.

The channel layer 180 protects elements under the channel layer 180 from etching at the time of etching of the light emitting structure 120, supports the light emitting structure 120 securely to protect the light emitting structure 120 from damage which is liable to take place in view of nature of the fabrication process.

And, the reflective layer 140 can be comprised of a metal layer including at least one selected from, but not limited to, aluminum Al, silver Ag, nickel Ni, platinum Pt, and rhodium Rh, or an alloy including aluminum Al, silver Ag, platinum Pt, or rhodium Rh. Aluminum Al or silver Ag makes effective reflection of the light from the active layer 124 to improve light extraction efficiency of the light emitting structure 120, significantly.

And, the ohmic layer 130 can be formed of a material including at least one selected from, but not limited to, ITO (indium tin oxide), IZO(indium zinc oxide), IZTO(indium zinc tin oxide), IAZO(indium aluminum zinc oxide), IGZO (indium gallium zinc oxide), IGTO(indium gallium tin oxide), AZO(aluminum zinc oxide), ATO(antimony tin oxide), GZO(gallium zinc oxide), IZON(IZO Nitride), AGZO(Al—Ga ZnO), IGZO(In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf.

And, the first conductive type semiconductor layer 122 can be formed of semiconductor compounds and embodied with a 3~5 group or 2~6 group compound semiconductor. And the first conductive type semiconductor layer can be doped with first conductive type dopant. If the first conductive type semiconductor layer 122 is an n type semiconductor layer, the first conductive type dopant can include, but not limited to, Si, Ge, Sn, Se, and Te as an n type dopant. And, according to the embodiment, the first conductive type semiconductor layer 122 can have a roughness formed on a surface thereof. A shape of the roughness of the embodiment is not limited.

And, the active layer 124 is a layer which emits a light having energy fixed by an energy bandgap unique to a material of the active layer (a light emitting layer) as an electron injected thereto through the first conductive type semiconductor layer 122 and a hole injected through the second conductive type semiconductor layer 126 to be formed later meet with each other.

And, the second conductive type semiconductor layer 126 can include a 3~5 group compound semiconductor doped with second conductive type dopant, for an example, a semiconductor having composition of $In_xAl_yGa_{1-x-y}N$ ($0 \leq x \leq 1$, $0 \leq y \leq 1$, $0 \leq x+y \leq 1$). If the second conductive type semiconductor layer 126 is a p type semiconductor layer, the second conductive type dopant can include Si, Mg, Zn, Ca, Sr, and Ba as a p type dopant.

The protective layer 110 is disposed at sides of the active layer 124 and the second conductive type semiconductor layer 126. In this instance, the protective layer 110 is formed by depositing an insulating material after etching the sides of the active layer 124 and the second conductive type semiconductor layer 126.

In this instance, the insulating material can be comprised of a non-conductive oxide or nitride. As an example, the protective layer 180 can be comprised at least one selected from, but not limited to, a silicon oxide $SiO_2$ layer, a silicon nitride $Si_3N_4$ layer, a titanium oxide TiOx, or an aluminum oxide $Al_2O_3$ layer.

The protective layer 110 prevents the first electrode 190 at sides of the light emitting structure 120 from being in contact with the active layer 124 and the second conductive type semiconductor layer 126, for preventing malfunction of the light emitting device from taking place.

And, the first electrode 190 of the embodiment can be disposed at least on a portion of the first conductive type semiconductor layer 122 and at the side of the light emitting structure.

And, the first electrode 190, disposed at least on the portion of the first conductive type semiconductor layer 122 and at the side of the light emitting structure, can be formed of at least one metal selected from a group including Mo, Cr, Ni, Au, Al, Ti, Pt, V, W, Pd, Cu, Rh or Ir, or an alloy of above metals.

The first electrode 190 of the embodiment can be disposed at least on a portion of the first conductive type semiconductor layer 122 and at a side of the light emitting structure 120. And, the protective layer 110 is disposed at sides of the active layer 124 and the second conductive type semiconductor layer 126, or a portion of a side of each of the active layer 124, the second conductive type semiconductor layer 126, and the first conductive type semiconductor layer 122. And the first electrode 190 can be disposed at a side of the protective layer 110 or at least on a portion of the protective layer 110.

In this instance, it is possible that, using a mask, the at least a portion of the first electrode 190 is disposed on the first conductive type semiconductor layer 122, and a portion of the first electrode 190 can be disposed at the side of the light emitting structure 120.

Eventually, the first electrode 190 of the embodiment, disposed at least on a portion of the first conductive type semiconductor layer 122 and at a side of the light emitting structure, can increase a contact area between the first electrode 190 and the first conductive type semiconductor layer 122, making a current flow from the first electrode to the first conductive type semiconductor layer 122 smooth, to reduce an operation voltage of the light emitting device, thereby improving efficiency.

Especially, since the embodiment makes the protective layer 110 to prevent the first electrode 190 from being in contact with the active layer 124 and the second conductive type semiconductor layer 126 even if the first electrode 190 is formed at the side of the light emitting structure 120, preventing the current from flowing, the embodiment has effects of improving security and reliability of the light emitting device by improving efficiency of the light emitting device and preventing malfunction.

Detailed description of the elements will be made with reference to FIGS. 2A~2K.

FIGS. 2A~2G illustrate sections showing the steps of a method for fabricating a light emitting device in accordance with a first embodiment.

Figure 2A:
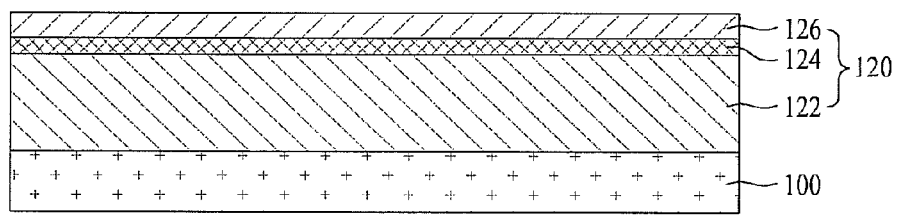

Referring to FIG. 2A, a substrate 100 is provided. The substrate 100 can be comprised of materials suitable for growing of semiconductor materials, or of a carrier wafer. The substrate 100 can be a conductive or insulating substrate, for an example, at least one of, sapphire $Al_2O_3$, SiC, Si, GaAs, GaN, ZnO, Si, GaP, InP, Ge, or $Ga_2O_3$. The roughness structure can be formed on the substrate 100, but not limited to this. The substrate 100 is subjected to wet washing, to remove impurity from a surface thereof.

And, a light emitting structure 120 including the first conductive type semiconductor layer 122, the active layer 124, and the second conductive type semiconductor layer 126 can be formed on the substrate 100.

In this instance, a buffer layer (Not shown) can be formed between the light emitting structure 120 and the substrate 100 for moderating lattice mismatch and a difference of thermal expansion coefficients of materials. The buffer layer can be formed of a 3~5 group compound semiconductor, for an example, at least one of GaN, InN, AlN, InGaN, AlGaN, InAlGaN, or AlInN. An undoped semiconductor layer can be formed on the buffer layer, but not limited to this.

And, the light emitting structure 120 can be formed by vapor deposition, such as MOCVD (Metal Organic Chemical Vapor Deposition), MBE (Molecular Beam Epitaxy), and HVPE (Hydride Vapor Phase Epitaxy).

The first conductive type semiconductor layer 122 can be comprised of semiconductor compounds, and embodied with a 3~5 group or 2~6 group compound semiconductor. The first conductive type semiconductor can be doped with first conductive type dopant. If the first conductive type semiconductor layer 122 is an n type semiconductor layer, the first conductive type dopant can include, but not limited to, Si, Ge, Sn, Se, and Te as an n type dopant.

The first conductive type semiconductor layer 122 can include a semiconductor material having composition of $Al_xIn_yGa_{(1-x-y)}N$ ($0 \leq x \leq 1$, $0 \leq y \leq 1$, $0 \leq x+y \leq 1$). And, the first conductive type semiconductor layer 122 can be formed of at least one selected from a group of material including GaN, InN, AlN, InGaN, AlGaN, InAlGaN, AlInN, AlGaAs, InGaAs, AlInGaAs, GaP, AlGaP, InGaP, AlInGaP or InP.

The first conductive type semiconductor layer 122 can be formed as an n type GaN layer by CVD, MBE, sputtering, or HYPE. And, the first conductive type semiconductor layer 122 can be formed by injection of TMGa gas, $NH_3$ gas, $N_2$ gas, and silane gas $SiH_4$ including n type impurity such as Si, into a chamber.

The active layer 124 is a layer which emits a light having energy fixed by an energy bandgap unique to a material of the active layer (a light emitting layer) as an electron injected thereto through the first conductive type semiconductor layer 122 and a hole injected thereto through the second conductive type semiconductor layer 126 to be formed later meet with each other.

The active layer 124 can be formed as at least one of single well structure, Multi Well structure, a Quantum-Wire structure, or a Quantum dot structure. For an example, the active layer 124 can be formed as the MQW (Multi Quantum Well) structure by injection of, but not limited to, TMGa gas, $NH_3$ gas, $N_2$ gas, and TMIn gas.

The active layer 124 has a pair structure of well layer/barrier layer comprised of at least any one of, but not limited to, InGaN/GaN, InGaN/InGaN, AlGaN/GaN, InAlGaN/GaN, GaAs/AlGaAs(InGaAs), or GaP/AlGaP(InGaP). The well layer can be formed of a material having a bandgap narrower than a bandgap of the barrier layer.

There can be a conductive clad layer (Not shown) disposed on or/and underside of the active layer 124. The conductive clad layer can be formed of an AlGaN group semiconductor to have an energy bandgap wider than the energy bandgap of the active layer 124.

The second conductive type semiconductor layer 126 can include a 3~5 group compound semiconductor doped with second conductive type dopant, for an example, a semiconductor having composition of $In_xAl_yGa_{1-x-y}N$ ($0 \leq x \leq 1$, $0 \leq y \leq 1$, $0 \leq x+y \leq 1$). If the second conductive type semiconductor layer 126 is a p type semiconductor layer, the second conductive type dopant can include at least one of Mg, Zn, Ca, Sr, or Ba as a p type dopant.

As the second conductive type semiconductor layer 126 can be formed as a p type GaN layer by injecting, but not limited to, TMGa gas, $NH_3$ gas, $N_2$ gas, and (EtCp$_2$Mg){Mg($C_2H_5C_5H_4$)$_2$} including p type impurity such as Mg into a chamber.

In the embodiment, the first conductive type semiconductor layer 122 can be embodied as a p type semiconductor layer, and the second conductive type semiconductor layer 126 can be embodied as an n type semiconductor layer. And, on the second conductive type semiconductor layer 126, a semiconductor layer having a polarity opposite to the second conductive type, for an example, an n type semiconductor layer (Not shown) can be formed if the second conductive type semiconductor layer 126 is the p type semiconductor layer. According to this, the light emitting structure 110 can be embodied as one of an n-p junction structure, a p-n junction structure, an n-p-n junction structure, and a p-n-p junction structure.

Figure 2B:
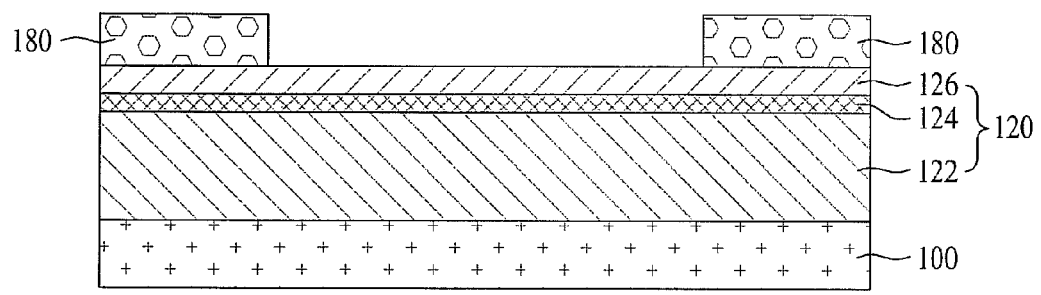

Then, referring to FIG. 2B, a channel layer 180 is stacked on the second conductive type semiconductor layer 126. In this instance, the channel layer 180 can be formed of a conductive material, or an insulating material of a non-conductive oxide or nitride. As an example, the channel layer 180 can be comprised of a silicon oxide $SiO_2$ layer, a silicon nitride $Si_3N_4$ layer, a titanium oxide TiOx, or an aluminum oxide $Al_2O_3$ layer. The channel layer 180 protects elements under the channel layer 180 from etching at the time of etching of the light emitting structure 120 to be described later, supports the light emitting structure securely to protect the light emitting structure from damage which is liable to take place in view of nature of the fabrication process.

And, the channel layer 180 is etched to form a recess. The recess can be formed by dry etching or the like with a mask.

Figure 2C:
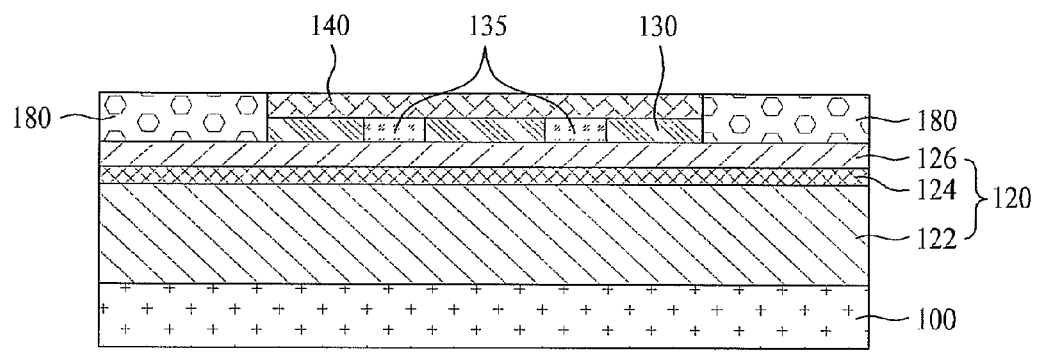

Then, referring to FIG. 2C, at least one of an ohmic layer 130 or a reflective layer 140 can be stacked in the recess on the second conductive type semiconductor layer 126.

In this instance, the ohmic layer 130 can be stacked at a thickness of about 200 Å. The ohmic layer 130 can be formed of at least one selected from a group of materials including, but not limited to, ITO(indium tin oxide), IZO(indium zinc oxide), IZTO(indium zinc tin oxide), IAZO(indium aluminum zinc oxide), IGZO(indium gallium zinc oxide), IGTO (indium gallium tin oxide), AZO(aluminum zinc oxide), ATO (antimony tin oxide), GZO(gallium zinc oxide), IZON(IZO Nitride), AGZO(Al—Ga ZnO), IGZO(In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf. The ohmic layer 130 can be formed by sputtering, or electron beam deposition. Moreover, according to the embodiment, a recess is formed in the ohmic layer 130, and a current blocking layer 135 is formed in the recess to spread a current flow in a horizontal direction, malfunction of the light emitting device caused by an over-current can be prevented, enhancing security and reliability of the light emitting device. The current blocking layer 135 can be formed between the ohmic layer 130 and the light emitting structure 120. The current blocking layer 135 can be formed of a material having electric conductivity lower than the reflective layer 140 or the ohmic layer 130, a material which forms Schottky contact with the second conductive type semiconductor layer 126, or an insulating material. For example, the current blocking layer 135 can include at least one of ZnO, $SiO_2$, SiON, $Si_3N_4$, $Al_2O_3$, $TiO_2$, Ti, Al, or Cr.

The current blocking layer 135 can be formed, but not limited to, between the ohmic layer 130 and the second conductive type semiconductor layer 126, or between the reflective layer 140 and the ohmic layer 130. The current blocking layer 135 is formed for making the current flow widely in the light emitting structure 120, but is not essential.

And, the reflective layer 140 can be formed on the ohmic layer 130 at a thickness of about 2500 Å. The reflective layer 140 can be comprised of a metal layer including aluminum Al, silver Ag, nickel Ni, platinum Pt, and rhodium Rh, or an alloy including aluminum Al, silver Ag, platinum Pt, or rhodium Rh. Aluminum Al or silver Ag makes effective reflection of the light from the active layer 124 to improve light extraction efficiency of the light emitting structure, significantly.

Figure 2D:
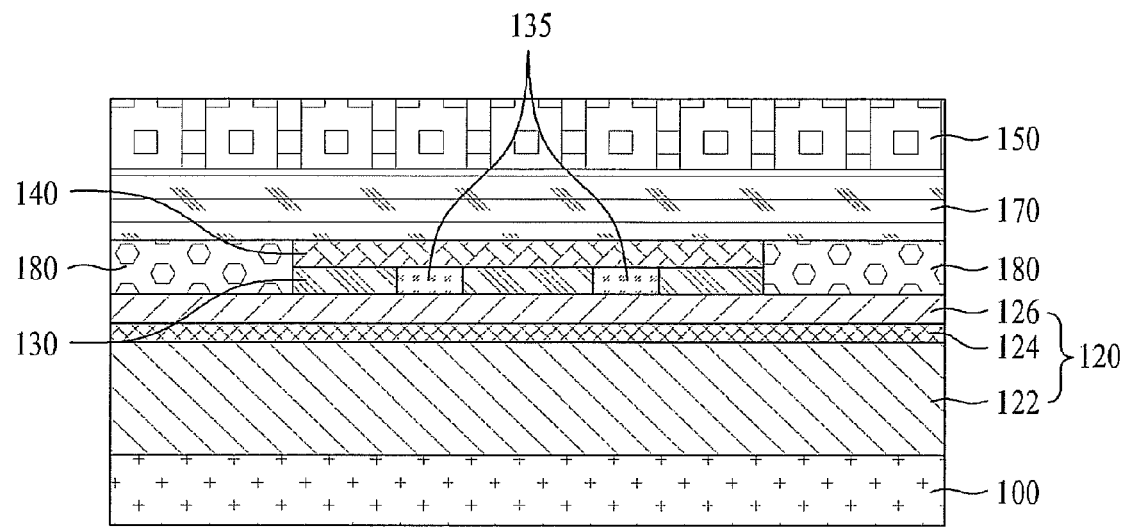

Then, referring to FIG. 2D, a conductive supporting layer 170 is formed on the reflective layer. The conductive supporting layer 170 can be comprised of a material selected from a group including nickel Ni, platinum Pt, tungsten W, vanadium V, iron Fe, and molybdenum Mo, or an alloy of materials selected from above.

The conductive supporting layer 170 can be formed by sputtering. In a case the sputtering is used, if a ionized atom is accelerated in an electric field and made to hit a source material of a layer 3 (170), atoms bounce out of the source material and deposit. Or according to the embodiment, the conductive supporting layer 170 can be formed by electro-chemical metal deposition, or bonding by using a eutectic metal. According to the embodiment, the conductive supporting layer 170 can be formed in a plurality of layers.

The conductive supporting layer 170 supports the light emitting structure 120 on the whole, to minimize mechanical damage (Breakage, or peel off) which is liable to take place in view of nature of fabrication process of the light emitting device.

A bonding layer 150 can be formed on the conductive supporting layer 170 for bonding the conductive supporting layer 170 to the supporting substrate 160. The bonding layer 150 can be formed of at least one material selected from a group including Au, Sn, In, Ag, Ni, Nb or Cu, or an alloy of above.

Figure 2E:
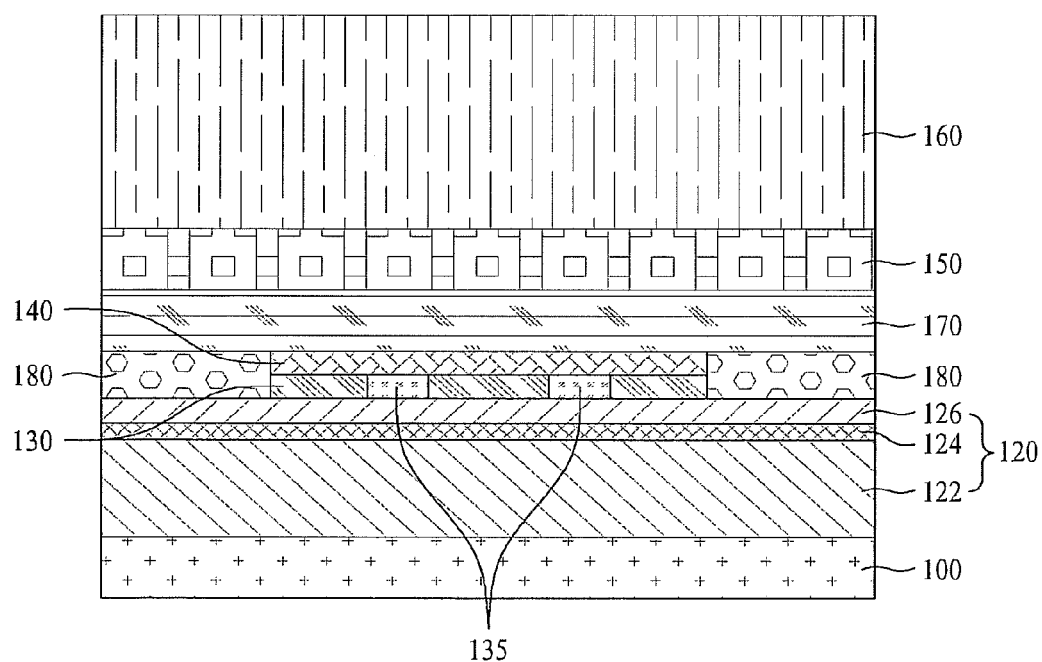

Then, referring to FIG. 2E, the supporting substrate 160 can be formed on the bonding layer 150.

The supporting substrate 160 can be formed of at least one material selected from a group including Mo, Si, W, Cu, Al or an alloy of above, and can include Au, a Cu Alloy, Ni, Cu—W, a carrier wafer (For an example: GaN, Si, Ge, GaAs, ZnO, SiGe, SiC, SiGe, $Ga_2O_3$ and so on), selectively. The conductive supporting substrate 160 can be formed by electro-chemical metal deposition, or bonding by using a eutectic metal.

According to the embodiment, in a case a hole is injected into the second conductive type semiconductor layer 126 through the conductive supporting layer 170, the supporting substrate 160 can be formed of an insulating material, and the insulating layer can be formed of a non-conductive oxide or nitride. As an example, the supporting substrate 160 can be constructed of a silicon oxide SiO2 layer, an oxidenitride layer, and an aluminum oxide layer.

Figure 2F:
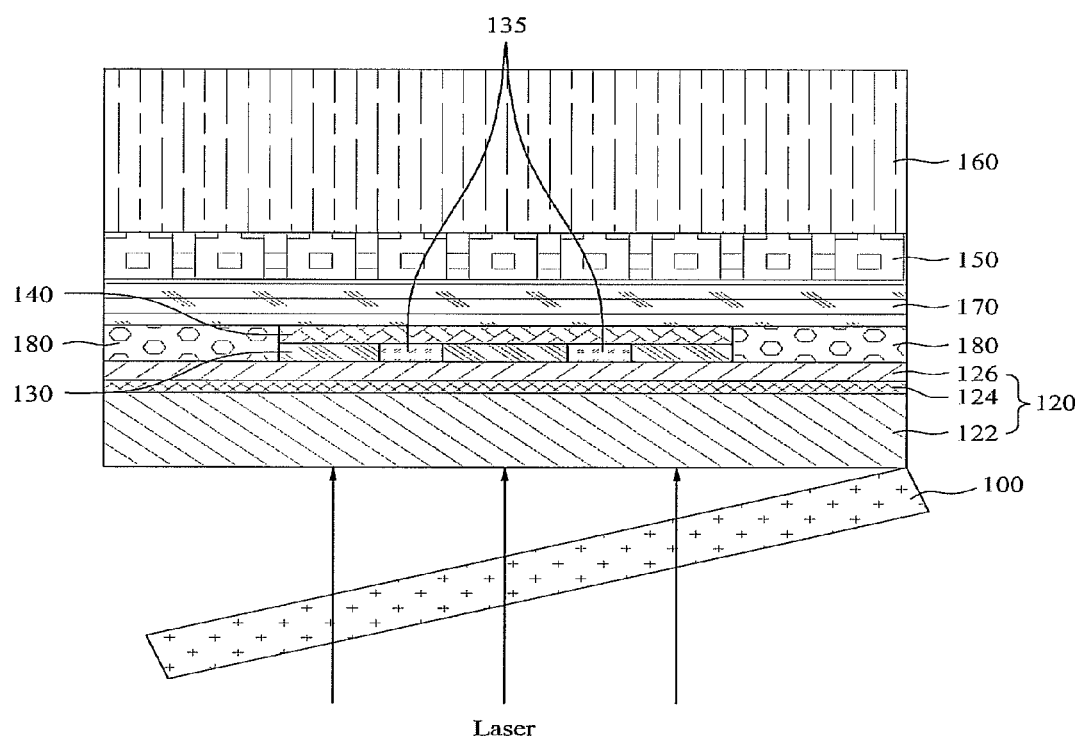

Then, referring to FIG. 2F, the substrate 100 is separated.

The substrate 100 can be separated by laser lift off (LLO) by using an excimer laser, or dry or wet etching.

In the case of laser lift off as an example, if an excimer laser beam of a predetermined wavelength band is focused toward the substrate 100, focusing thermal energy at a boundary of the substrate 110 and the light emitting structure 120 to separate gallium molecules from nitrogen molecules, the substrate 100 is separated instantly at a portion the laser beam passes.

Figure 2G:
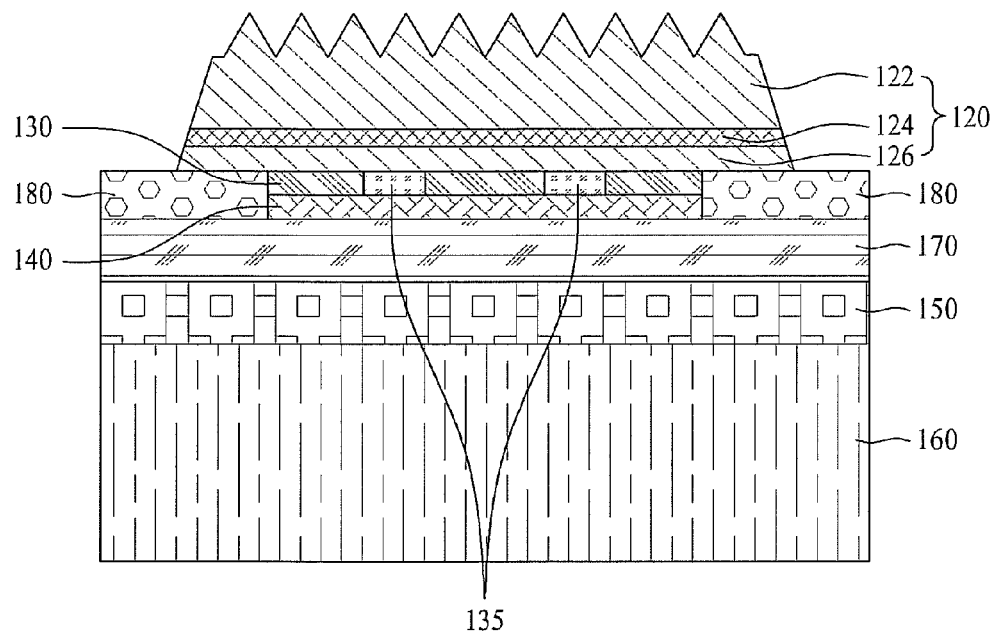

Then, referring to FIG. 2G, a side of the light emitting structure 120 is etched. In this instance, a portion of the side of the light emitting structure 120 can be etched by a method in which, if a material of the channel 180 layer is detected by, an end point detecting, the etching is stopped.

In this instance, a position of the etching can be adjusted to position the channel layer 180 on an underside of the light emitting structure 120 to be etched.

The channel layer 180 protects elements under the channel layer 180 from etching at the time of etching of the light emitting structure 120, supports the light emitting structure 120 securely to protect the light emitting structure 120 from damage which is liable to take place in view of nature of the fabrication process.

Then, referring to FIG. 2G, a roughness structure is formed on the first conductive type semiconductor layer 122 to improve light extraction efficiency. The roughness structure can be formed by PEC, or etching with a mask.

In the PEC, by adjusting an amount of an etching solution (for an example, KOH, or NaOH) and a difference of etch rates came from GaN crystallinity, a shape of micron sized roughness can be adjusted. The roughness structure can be periodic or non-periodic.

And, according to the embodiment, two dimensional photonic crystal can be formed on a surface of the first conductive type semiconductor layer 122 to have a structure in which at least two kinds of dielectrics having refractive indices different from each other are arranged in a period of about a half of the wavelength of the light. In this instance, the dielectrics can have identical patterns.

The photonic crystal forms a photonic band gap on the surface of the first conductive type semiconductor layer 122 to control a light flow.

The recess and pattern structure of the light emitting structure can increase a surface area of the light emitting structure to enhance the light extraction efficiency, and the micron roughness structure on the surface can reduce absorption of the light in the light emitting structure, thereby increasing the light emission efficiency.

Figure 2H:
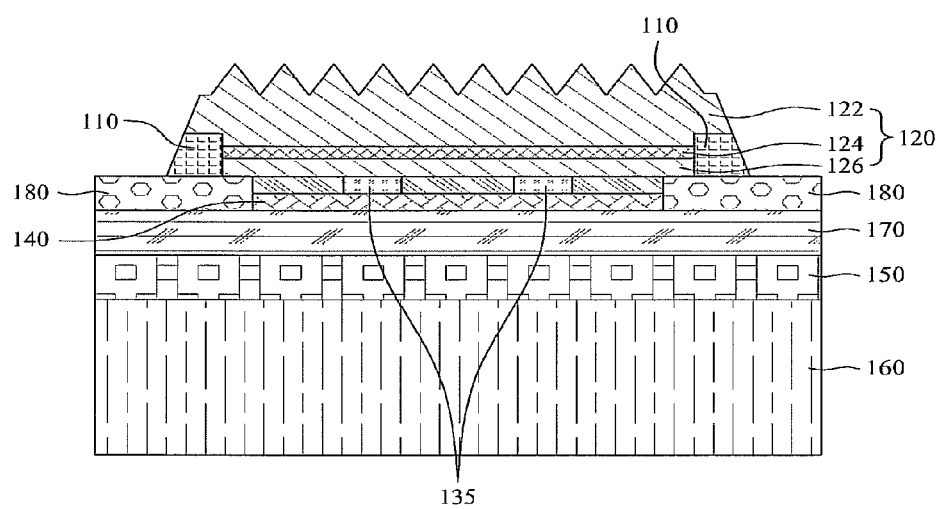

The referring to FIG. 2H, a portion of a side of the light emitting structure 120 is etched to form a recess, and an insulating material is filled in the recess, to form a protective layer 110.

In this instance, the recess can be formed in sides of the active layer 124 and the second conductive type semiconductor layer 126, or according to the embodiment, the recess can be formed in a region including the sides of the active layer 124 and the second conductive type semiconductor layer 126 and a portion of a side of the first conductive type semiconductor layer 122 by PEC or etching with a mask formed beforehand. In the PEC, by adjusting an amount of an etching solution (for an example, KOH, or NaOH) and a difference of etch rates come from GaN crystallinity, a size and a shape of the recess can be adjusted.

By filling an insulating material in the recess formed thus, a protective layer 110 is formed at the sides of the active layer 124 and the second conductive type semiconductor layer 126, or the sides of the active layer 124, and the second conductive type semiconductor layer 126, and a portion of a side of the first conductive type semiconductor layer 122.

In this instance, the insulating material can be comprised of a non-conductive oxide or nitride. As an example, the protective layer 180 can be comprised of a silicon oxide $SiO_2$ layer, a silicon nitride $Si_3N_4$ layer, a titanium oxide TiOx, or an aluminum oxide $Al_2O_3$ layer, or an alloy including above, selectively.

Figure 2I:
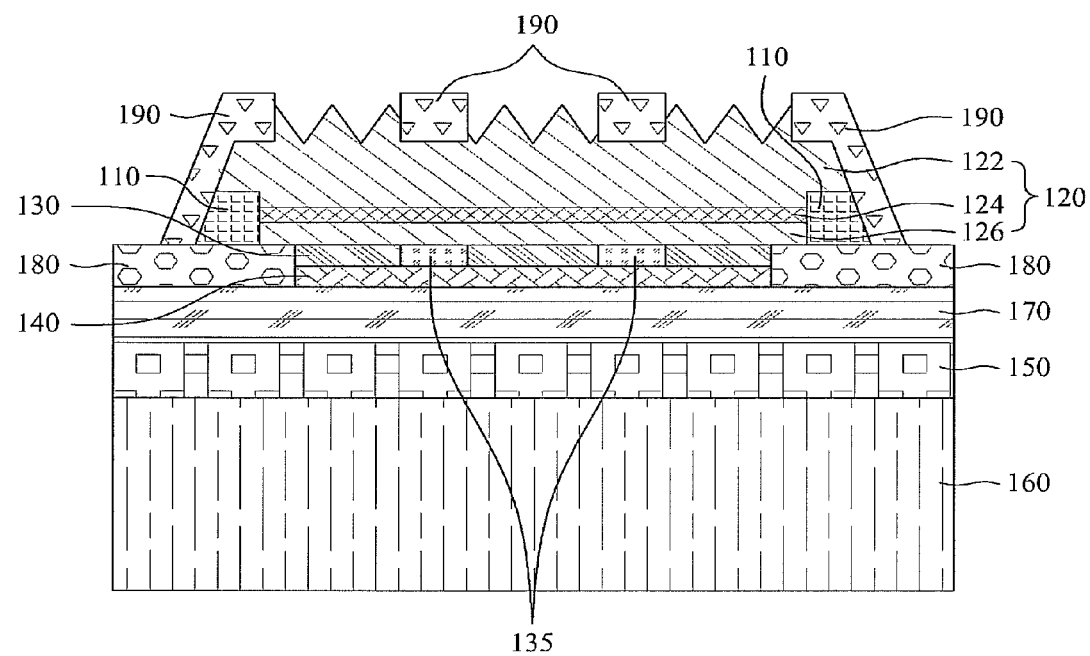

Then, referring to FIG. 2I, a first electrode 190 can be formed on at least a portion of the first conductive type semiconductor layer 122 and a side of the light emitting structure 120. In this instance, it is possible that at least a portion of the first electrode 190 is formed on the first conductive type semiconductor layer 122 by using a mask, and a portion of the first electrode 190 is formed at a side of the light emitting structure 120.

And, the protective layer 110 is formed at sides of the active layer 124 and the second conductive type semiconductor layer 126, or at the sides of the active layer 124 and the second conductive type semiconductor layer 126, and a portion of a side of the first conductive type semiconductor layer 122, and the first electrode 190 can be formed at a side of the protective layer 110 or at least a portion of the protective layer 110.

And, the first electrode 190 can be formed on at least a portion of the channel layer 180, and, if the channel layer is formed of a conductive material, the channel layer 180 and the first electrode 190 can be connected electrically. If the channel layer 180 and the first electrode 190 are connected electrically, a current supplied to the light emitting structure 120 can be supplied through the channel layer 180 or a pad portion of the first electrode 190.

The first electrode 190 can be comprised of one metal selected from a group including Mo, Cr, Ni, Au, Al, Ti, Pt, V, W, Pd, Cu, Rh and Ir, or an alloy of above metals.

Eventually, the first electrode 190 of the embodiment, formed at least on a portion of the first conductive type semiconductor layer 122 and at a side of the light emitting structure 120, can increase a contact area between the first electrode 190 and the first conductive type semiconductor layer 122, making a current flow from the first electrode to the first conductive type semiconductor layer 122 smooth, to reduce an operation voltage of the light emitting device, thereby improving efficiency.

Especially, since the embodiment makes the protective layer 110 prevent the first electrode 190 from being in contact with the active layer 124 and the second conductive type semiconductor layer 126 even if the first electrode 190 is formed at the side of the light emitting structure 120, preventing the current from flowing, the embodiment has effects of improving security and reliability of the light emitting device by improving efficiency of the light emitting device and preventing malfunction.

That is, the protective layer 110 prevents the first electrode 190 at sides of the light emitting structure 120 from being in contact with the active layer 124 and the second conductive type semiconductor layer 126, for preventing malfunction of the light emitting device from taking place.

Figure 2J:
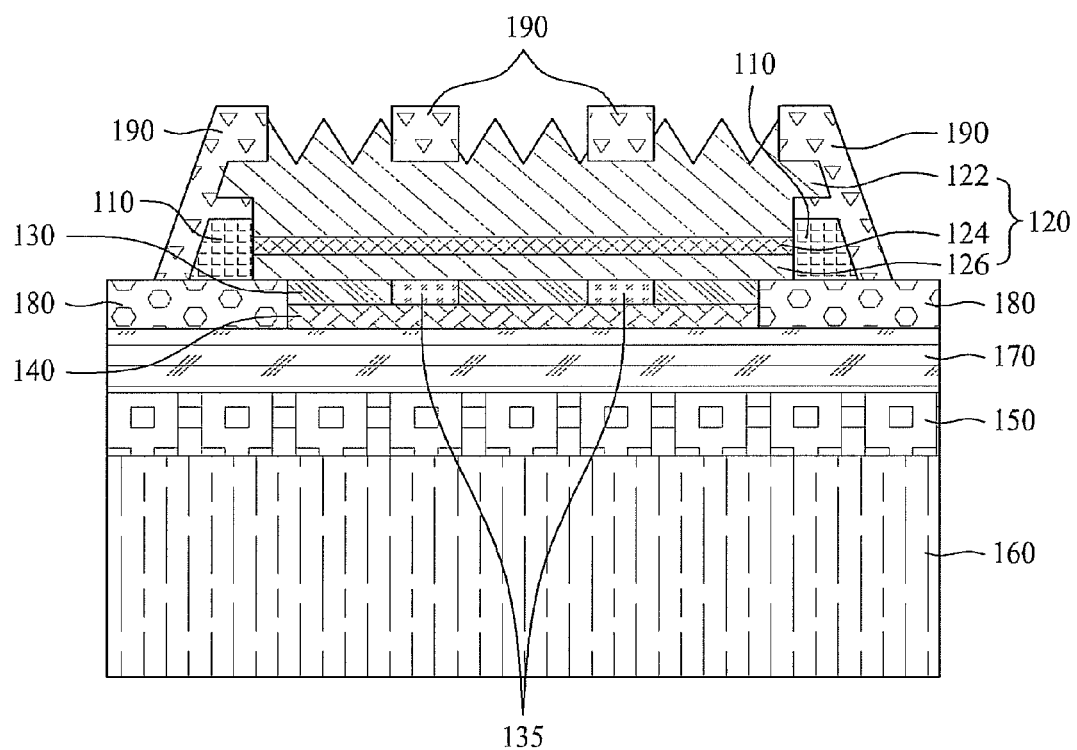

Then, referring to FIG. 2J, according to the embodiment, the protective layer 110 is formed at sides of the active layer 124 and the second conductive type semiconductor layer 126, or at the sides of the active layer 124 and the second conductive type semiconductor layer 126 and a portion of a side of the first conductive type semiconductor layer 122, and the first electrode 190 can be formed at least on a portion of a side of the protective layer 110 or at least on a portion of the protective layer 110. That is, by expanding a region at which the first electrode 190 is formed to a portion of the protective layer 110, expanding a contact area the first electrode 190 is in contact with the first conductive type semiconductor layer 122, making a current flow smooth to reduce an operation voltage of the light emitting device, efficiency of the light emitting device can be enhanced.

Figure 2K:
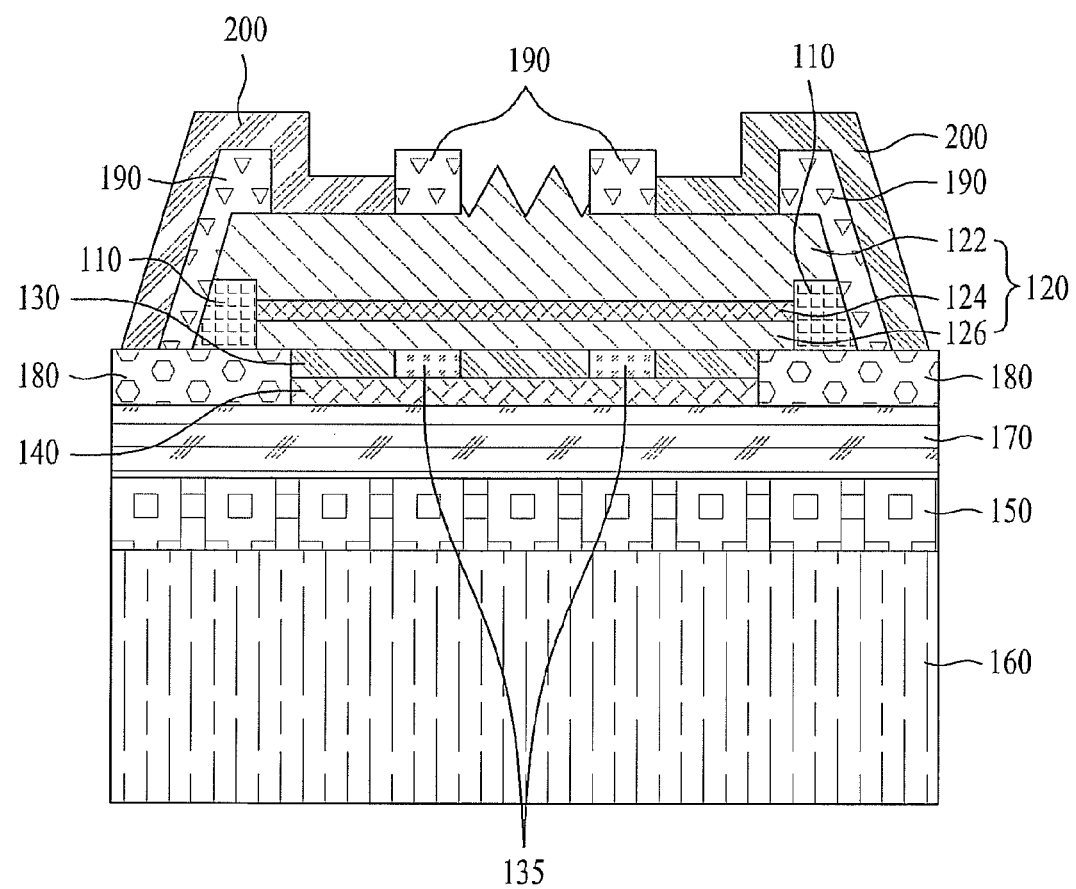
Figure 2I:
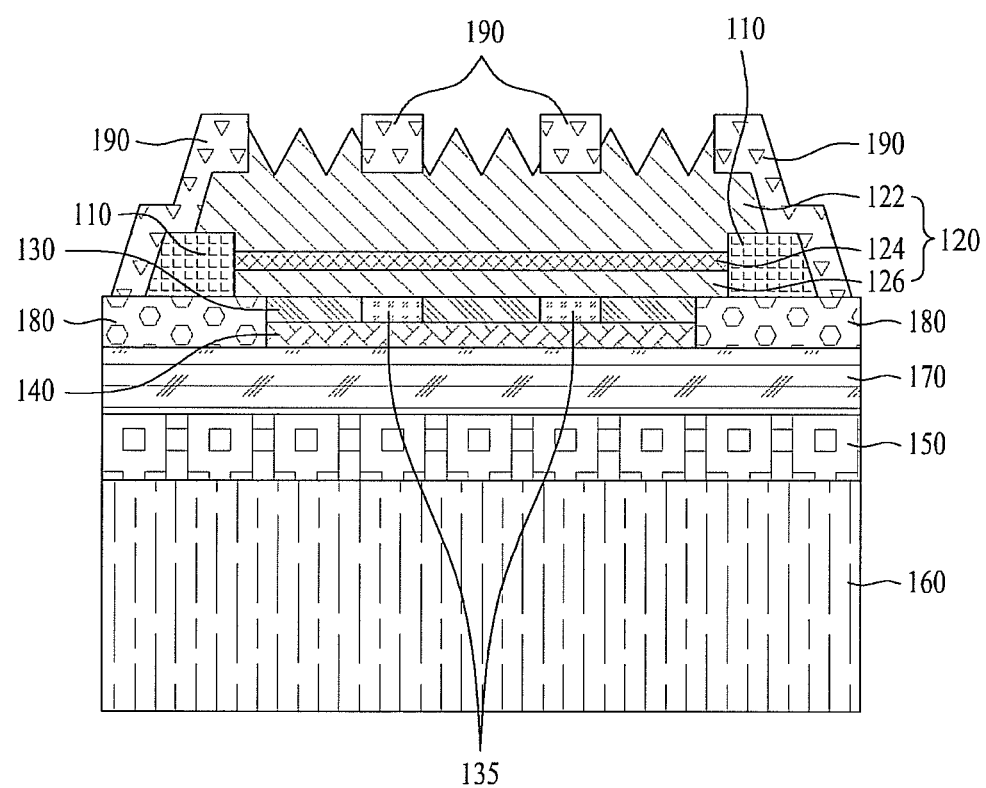

Then, referring to FIG. 2K, according to the embodiment, a passivation layer 200 can be deposited at least on a portion of the first conductive type semiconductor layer 122, at least on a portion of the first electrode 190 formed at the side of the light emitting structure 120, and at least on a portion of the channel layer 180.

In this instance, the passivation layer 200, and 201 can be formed of an insulating material, and the insulating material can be a non-conductive oxide or nitride for protecting the light emitting structure 120. As an example, the passivation layer can be comprised of a silicon oxide $SiO_2$ layer, a silicon nitride layer, or an aluminum oxide layer.

Then, referring to FIG. 2L, according to the embodiment, the protective layer 110 can be formed projected from a side of an underside of the light emitting structure 120, and the first electrode 190 can be formed on the protective layer 110 projected thus. As the protective layer 110 is formed projected thus, the first electrode 190 formed on the projected protective layer 110 can have an expanded area.

Figure 3:
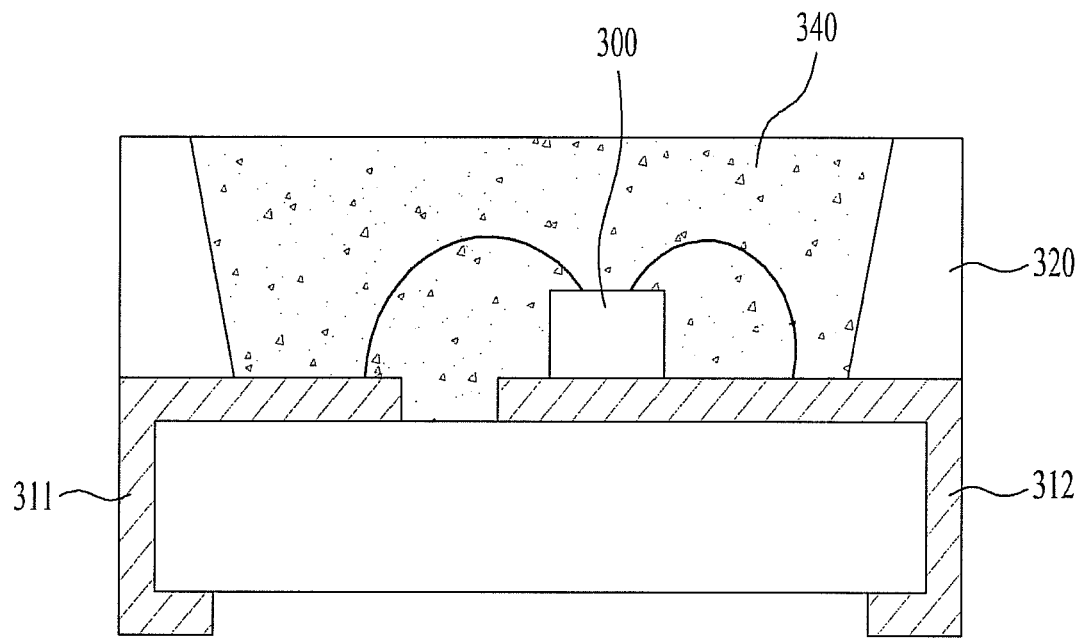
FIG. 3 illustrates a section of a light emitting device package in accordance with an embodiment.

FIG. 3 illustrates a section of a light emitting device package in accordance with a first embodiment.

Referring to FIG. 3, the light emitting device package includes a package body 320, a first electrode layer 311 and a second electrode layer 312 mounted to the package body 320, a light emitting device 300 of the embodiment mounted to the package body 320 and connected to the first electrode layer 311 and the second electrode layer 312 electrically, and a molding part 340 for enclosing the light emitting device 300.

The package body 320 can be formed of silicone, synthetic resin, or metal, and enhance the light extraction efficiency as there is a sloped surface formed around the light emitting device 300.

The first electrode layer 311 and the second electrode layer 312 are isolated from each other electrically, and provide power to the light emitting device 300. And, the first electrode layer 311 and the second electrode layer 312 can increase optical efficiency by reflecting the light from the light emitting device 300, and can also dissipate heat from the light emitting device 300 to an outside of the light emitting device package.

The light emitting device 300 can be disposed on the package body 320, or the first electrode layer 311, or the second electrode layer 312.

The light emitting device 300 can connected to the first electrode layer 311 and the second electrode layer 312 by a wire type, flip chip type, or die bonding type, electrically.

The molding part 340 can enclose the light emitting device 300 to protect the same. And, the molding part 340 can have a fluorescent material included thereto for changing a wavelength of the light from the light emitting device 300.

The light emitting device package can have at least one or a plurality of, but not limited to, the light emitting device disclosed in any one of the embodiments.

An array of the light emitting device packages of the embodiment can be on a substrate, and a light guide plate, a prism sheet, a diffusion sheet, and the like that are optical members can be disposed on a light path of the light emitting device package. The light emitting device package, the substrate, and the optical members can function as a lighting unit. As another embodiment, a display device, an indicating device, or a lighting system can be produced, which includes the semiconductor light emitting device or the light emitting device package described in the foregoing embodiments, and the lighting system can include, for an example, a lamp or a street light.

Figure 4:
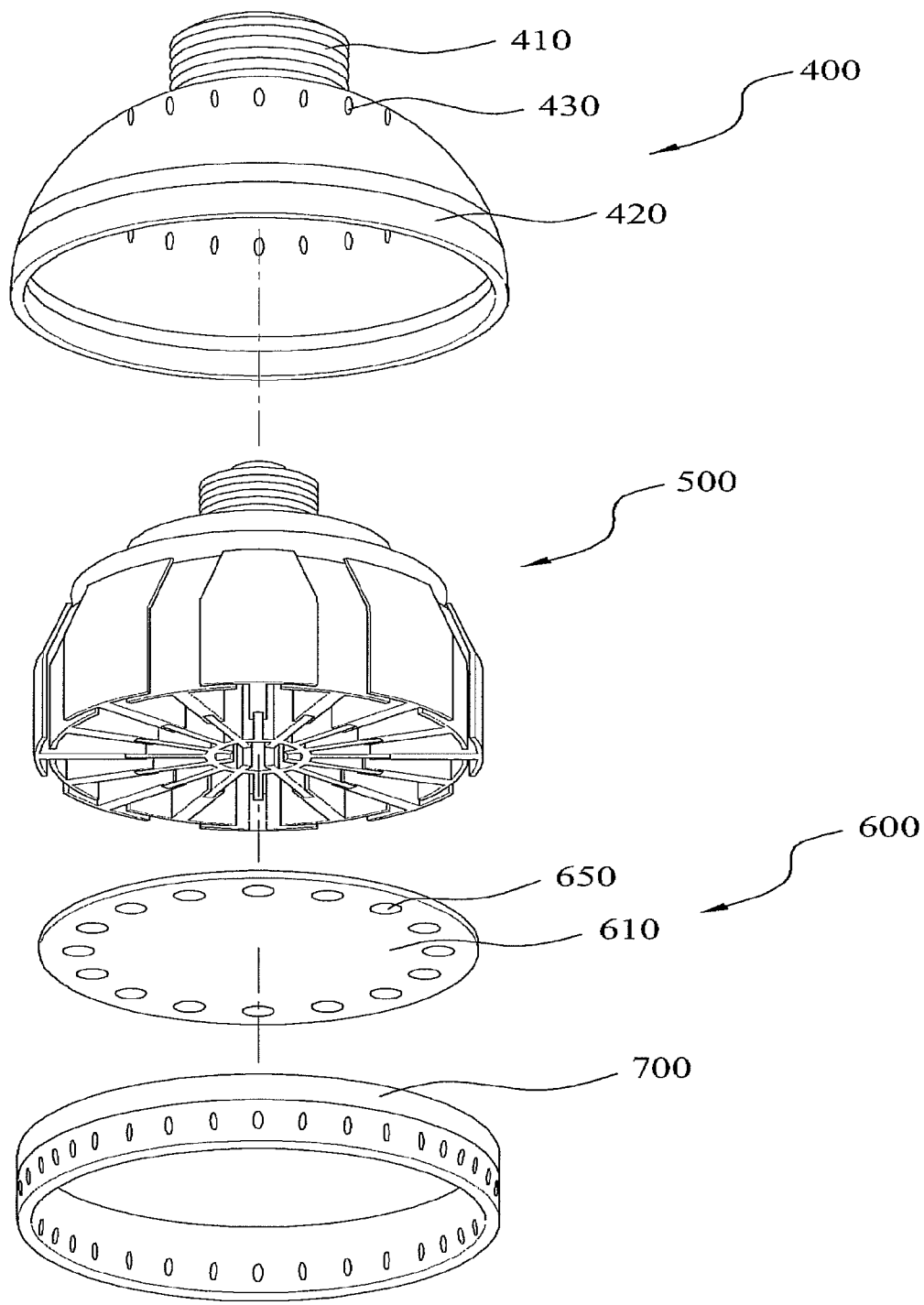
FIG. 4 illustrates an exploded perspective view of a lighting device in accordance with a preferred embodiment of the present invention, having a light emitting device module in accordance with one of embodiments applied thereto.

As one embodiment of a lighting system having the foregoing light emitting device mounted thereto, a lighting device and a backlight unit will be described. FIG. 4 illustrates an exploded perspective view of a lighting device in accordance with an embodiment having a light emitting device module of the foregoing embodiment applied thereto.

Referring to FIG. 4, the lighting device includes a light source 600 for projecting a light, a housing 400 for housing the light source 600, a heat dissipating unit 500 for dissipating heat from the light source 600, and a holder 700 for fastening the light source 600 and the heat dissipating unit 500 to the housing 400.

The housing 400 includes a socket fastening portion 410 for fastening the housing 400 to an electric socket (Not shown) and a body portion 420 connected to the socket fastening portion 410 for housing the light source 600. The body portion 420 can have an air flow opening 430 passing therethrough.

The body portion 420 of the housing 400 has a plurality of air flow openings 430. The air flow opening 430 may be singular or plural disposed radially as shown in the drawing. Besides this, the arrangement of the air flow opening 430 can vary.

And, the light source 600 has a plurality of light emitting device packages 650 provided on a substrate 610. The substrate 610 can have a shape that can be placed in an opening of the housing 400, and can be formed of a material having high heat conductivity for transfer of heat to the heat dissipating unit 500, to be described later.

The holder 700 is provided under the light source, including a frame and another air flow openings. Though not shown, an optical member can be provided to a lower side of the light source 600 for making the light from the light emitting device package 600 of the light source 600 to diverge, scatter, or converge.

Figure 5:
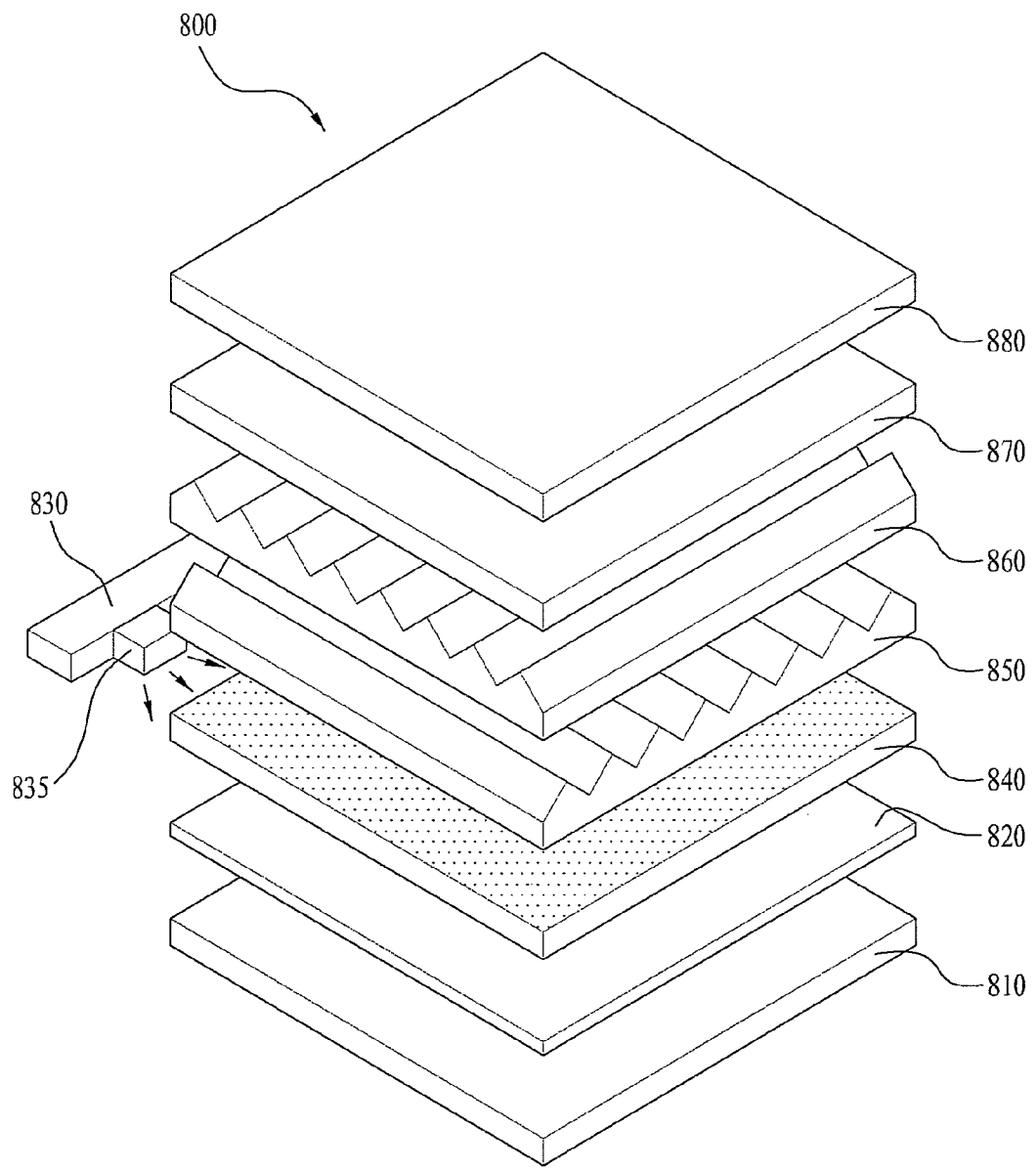
FIG. 5 illustrates an exploded perspective view of a display device in accordance with a embodiment, having a light emitting device in accordance with one of embodiments applied thereto.

FIG. 5 illustrates an exploded perspective view of a display device having a light emitting device in accordance with a embodiment applied thereto.

Referring to FIG. 5, the display device 800 includes a light source module 830 and 835, a reflective plate 820 on a bottom cover 810, a light guide plate 840 disposed in front of the reflective plate 820 for guiding the light from the light source module to a front of the display device, a first prism sheet 850 and a second prism sheet 860 disposed in front of the light guide plate 840, a panel 870 disposed in front of the second prism sheet 860, and a color filter 880 disposed in front of the panel 870.

The light source module includes a light emitting device package 835 on a substrate 830. The bottom cover 810 can accommodate elements of the display device 800. And, the reflective plate 820 can be an individual element as shown in the drawing, or can be a coat of a material with a high reflectivity on a rear of the light guide plate 840 or on a front of the bottom cover 810.

In this instance, the reflective plate 820 can be formed of a material which has high reflectivity and can form a micronfilm, such as PET (PolyEthylene Terephtalate).

The light guide plate 840 scatters the light from the light emitting device package module for uniform distribution of the light to an entire region of a screen of the liquid crystal display panel. Accordingly, the light guide plate 840 is formed of a material having good refractivity and transmissivity, such as PolyMethylMethAcrylate PMMA, PolyCarbonate PC, or PolyEthylene PE.

And, the light guide plate can be omitted so as to be configured as an air guide type in which the light is transmitted through a space between the reflective plate 820 and the first prism sheet 850.

And, the first prism sheet 850 can be formed of a polymer having light transmissivity and elasticity on one side of a supporting film. The polymer can have a prism layer with a plurality of three dimensional structures formed thereon, repeatedly. In this instance, as shown, the plurality of patterns can be a stripe type with repetitive ridges and grooves.

And, a direction of the ridges and the grooves in the second prism sheet 860 can be perpendicular to a direction of the ridges and the grooves in the first prism sheet 850, for uniform distribution of the light from the light source module and the reflective sheet to an entire surface of the panel 870.

Though not shown, each of the prism sheets can have a protective sheet provided thereon by providing a protective layer having light diffusing particles and a binder on both sides of the supporting film.

And, the prism layer can be formed of a polymer material selected from a group having polyurethane, styrene butadiene copolymer, polyacrylate, polymethacrylate, polymethylmethacrylate, polyethyleneterephthalate elastomer, polyisoprene, and polysilicone.

And, though not shown, a diffusion sheet can be disposed between the light guide plate 840 and the first prism sheet 850. The diffusion sheet can be formed of a material selected from a polyester group and a polycarbonate group, for widening a light projection angle to the maximum by refraction and scattering of the light from the backlight unit.

The diffusion sheet can include a supporting layer having light diffuser contained therein, and a first layer and a second layer both without the light diffuser contained therein formed on a light forwarding surface (a first prism sheet direction) and a light incident surface (a reflective sheet direction).

The supporting layer can consist of 100 parts by weight of a mixed resin of Methacrylate-styrene copolymer and Methacrylate methyl-styrene copolymer, added with 0.1~10 parts by weight of siloxane group optical diffuser having an average particle diameter of 1~10 μm, and 0.1~10 parts by weight of acryl group optical diffuser having an average particle diameter of 1~10 μm.

The first layer and the second layer can consist of 100 parts by weight of a resin of Methacrylate methyl-styrene copolymer, added with 0.01~1 parts by weight of UV ray absorbent, and 0.001~10 parts by weight of antistatic agent.

In the diffusion sheet, the supporting layer can have a thickness of 100~10000 μm, and each of the layers can have a thickness of 10~1000 μm.

In the embodiment, the diffusion sheet, the first prism sheet 850 and the second prism sheet 860 construe the optical sheet. The optical sheet can be constructed of other combination, for an example, a microlens array, a combination of the diffusion sheet and the microlens array, a combination of one prism sheet and the microlens array, or so on.

As the panel 870, a liquid crystal panel can be applied, and besides the liquid crystal panel 860, other kinds of display devices each of which requires a light source can be applied.

The panel 870 has liquid crystals disposed between glass panels, and a polarizing plate placed on both of the glass panels for utilizing polarizability of a light. The liquid crystals have intermediate characteristics of liquid and solid, in which the liquid crystals, organic molecules with fluidity like the liquid, are disposed regularly like crystal. By utilizing a characteristic of the liquid crystals in which a molecular arrangement varies with an external electric field, a picture is displayed.

The liquid crystal panel used in the display device has an active matrix system, in which a transistor is used as a switch for controlling a voltage supplied to pixels.

The panel 870 has a color filter 880 on a front for each of pixels to transmit only red, green and blue lights of the light from the panel 870, thereby displaying a picture.

And, the image display device of the embodiment can include the liquid crystal display device and an image signal generating unit for providing an image signal to the liquid crystal display device.

As has been describe, the light emitting device of the embodiment has the following advantage.

By making a smooth current flow in the light emitting device to reduce an operation voltage of the light emitting device, efficiency of the light emitting device is improved.

Although embodiments have been described with reference to a number of illustrative embodiments thereof, ti should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting diode comprising:
    a light emitting structure including a first conductive type semiconductor layer, an active layer, and a second conductive type semiconductor layer;
    a protective layer disposed at a side of the light emitting structure; and
    a first electrode disposed on an outside of the protective layer,
    wherein the first conductive type semiconductor layer has a top surface, a bottom surface and a side surface between the top surface and the bottom surface,
    wherein the first electrode includes a first portion arranged in a first direction and a second portion arranged in a second direction different from the first direction, the first portion of the first electrode contacts a side surface of the protective layer and at least a portion of the side surface of the first conductive type semiconductor layer, and the first portion of the first electrode is disposed along the side surface of the first conductive type semiconductor layer, a side surface of the active layer and a side surface of the second conductive type semiconductor layer, and
    wherein the first portion of the first electrode includes a slope.

2. The light emitting diode as claimed in claim 1, wherein the protective layer is disposed at sides of the active layer and the second conductive type semiconductor layer, or at a portion of a side of each of the active layer, the second conductive type semiconductor layer and the first conductive type semiconductor layer.

3. The light emitting diode as claimed in claim 1, wherein the protective layer is formed of a non-conductive material selected from silicon oxide $SiO_2$, silicon nitride $Si_3N_4$, titanium oxide $TiO_x$, and aluminum oxide $Al_2O_3$, or a non-conductive material including above, selectively.

4. The light emitting diode as claimed in claim 1, wherein the first conductive type semiconductor layer electrically contacts the first electrode.

5. The light emitting diode as claimed in claim 1, wherein the first electrode is disposed on an outside of the protective layer and at least on a portion of the protective layer.

6. The light emitting diode as claimed in claim 1, wherein the first electrode contacts at least a portion of the protective layer.

7. The light emitting diode as claimed in claim 1, wherein the first electrode contacts an outside of the first conductive type semiconductor layer and an outside of the protective layer.

8. The light emitting diode as claimed in claim 1, further comprising a passivation layer disposed at least on a portion of the first conductive type semiconductor layer, and at least on a portion of the first electrode disposed at a side of the light emitting structure.

9. The light emitting diode as claimed in claim 1, further comprising at least one of an ohmic layer or a reflective layer disposed under the light emitting structure.

10. The light emitting diode as claimed in claim 1, further comprising a channel layer disposed on an underside of the protective layer.

11. The light emitting diode as claimed in claim 1, wherein the second portion of the first electrode is disposed on the first conductive type semiconductor layer, and the first portion of the first electrode is disposed at a side of the light emitting structure, and the first portion and the second portion are connected to each other, electrically.

12. A backlight unit comprising:
    a light source module including at least one of the light emitting diodes as claimed in claim 1;
    a light guide plate for guiding a light from the light source module;
    an optical sheet disposed on a front of the light guide plate; and
    a bottom cover disposed under the light guide plate.

13. The light emitting diode as claimed in claim 1, wherein the protective layer is provided between the side surface of the active layer and the first portion of the first electrode, and the protective layer is provided between the side surface of the second conductive type semiconductor layer and the first portion of the first electrode.

14. A light emitting diode comprising:
    a second conductive type semiconductor layer and an active layer disposed on the second conductive type semiconductor layer;
    a protective layer disposed at sides of the second conductive type semiconductor layer and the active layer;
    a first conductive type semiconductor layer disposed on the active layer and the protective layer; and
    a first electrode disposed on an outside of the protective layer and at least one side of the first conductive type semiconductor layer,
    wherein the first conductive type semiconductor layer has a top surface, a bottom surface and a side surface between the top surface and the bottom surface,
    wherein the first electrode includes a first portion arranged in a first direction and a second portion arranged in a second direction different from the first direction, the first portion of the first electrode contacts a side surface of the protective layer and at least a portion of the side surface of the first conductive type semiconductor layer, and the first portion of the first electrode is disposed along the side surface of the first conductive type semiconductor layer, a side surface of the active layer and a side surface of the second conductive type semiconductor layer, and wherein the first portion of the first electrode includes a slope.

15. The light emitting diode as claimed in claim 14, wherein the protective layer is disposed at a portion of a side of the active layer, the second conductive type semiconductor layer, and the first conductive type semiconductor layer.

16. The light emitting diode as claimed in claim 14, wherein the protective layer is formed of a non-conductive material selected from silicon oxide $SiO_2$, silicon nitride $Si_3N_4$, titanium oxide TiOx, and aluminum oxide $Al_2O_3$, or a non-conductive material including above, selectively.

17. The light emitting diode as claimed in claim 14, wherein the first conductive type semiconductor layer electrically contacts the first electrode.

18. The light emitting diode as claimed in claim 14, wherein the first electrode is disposed on an outside of the protective layer and at least on the portion of the protective layer.

19. The light emitting diode as claimed in claim 14, wherein the first electrode contacts an outside of an upper side of the protective layer.

20. The light emitting diode as claimed in claim 14, further comprising a channel layer disposed on an underside of the protective layer.

21. The light emitting diode as claimed in claim 14, further comprising at least one of an ohmic layer or a reflective layer disposed under the second conductive type semiconductor layer.

* * * * *